US010705900B2

(12) United States Patent
Jin (10) Patent No.: US 10,705,900 B2
(45) Date of Patent: Jul. 7, 2020

(54) PROGRAM VERIFY ADAPTATION FOR FLASH MEMORY

(71) Applicant: Western Digital Technologies, Inc., San Jose, CA (US)

(72) Inventor: Ming Jin, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 203 days.

(21) Appl. No.: 15/951,097

(22) Filed: Apr. 11, 2018

(65) Prior Publication Data

US 2019/0243699 A1    Aug. 8, 2019

Related U.S. Application Data

(60) Provisional application No. 62/625,907, filed on Feb. 2, 2018.

(51) Int. Cl.
| | | |
|---|---|---|
| *G06F 11/00* | (2006.01) | |
| *G06F 11/07* | (2006.01) | |
| *G06F 11/10* | (2006.01) | |
| *G11C 29/00* | (2006.01) | |

(52) U.S. Cl.
CPC ........ *G06F 11/0754* (2013.01); *G06F 11/073* (2013.01); *G06F 11/1048* (2013.01); *G11C 29/00* (2013.01)

(58) Field of Classification Search
CPC . G06F 11/0754; G06F 11/073; G06F 11/1048
See application file for complete search history.

(56) References Cited

U.S. PATENT DOCUMENTS

| | | | |
|---|---|---|---|
| 9,583,135 | B1 * | 2/2017 | Ma ................. G11B 20/10305 |
| 2002/0136357 | A1 * | 9/2002 | Suonsivu .............. H04L 1/0001 379/1.04 |
| 2011/0267886 | A1 | 11/2011 | Tanaka et al. |
| 2013/0176784 | A1 | 7/2013 | Cometti et al. |
| 2014/0059406 | A1 | 2/2014 | Hyun et al. |
| 2016/0172051 | A1 | 6/2016 | Liang et al. |
| 2017/0287568 | A1 | 10/2017 | Yang et al. |

OTHER PUBLICATIONS

International Search Report and Written Opinion from PCT/US2019/014060, dated May 1, 2019, 11 pages.

* cited by examiner

*Primary Examiner* — Katherine Lin (74) *Attorney, Agent, or Firm* — Morgan, Lewis & Bockius LLP (57) ABSTRACT

Disclosed is a system and method for providing program verify adaptation for flash memory. The method includes performing an adjustment iteration, which includes accessing error counts for respective N states of a plurality of memory cells, applying a weighting to the error counts based on a binary data coding for the N states, determining a state Smin of the N states having a minimum error count Emin from the error counts, determining a state Smax of the N states having a maximum error count Emax from the error counts, determining a difference between the Emax and the Emin satisfies an error count threshold, and adjusting, by a predefined value, a respective program verify offset of a lowest state from Smin and Smax, and of each state between Smin and Smax in the N states, wherein the adjusting is a decrement when Smin is less than Smax and an increment otherwise.

20 Claims, 10 Drawing Sheets

PROGRAM VERIFY ADAPTATION FOR FLASH MEMORY

CROSS-REFERENCE TO RELATED APPLICATION

This application claims the benefit of U.S. Provisional Application No. 62/625,907, titled "PROGRAM VERIFY ADAPTATION FOR HIGH DENSITY FLASH MEMORY" and filed Feb. 2, 2018, which is hereby incorporated by reference in its entirety.

BACKGROUND

NAND flash continues to evolve with higher data density to meet enterprise and consumer demands for high capacity, high performance, and cost effective data storage. As the number of states in a memory cell increases from multi-level cell (MLC) to triple-level cell (TLC), quad-level cell (QLC), X5 and beyond, it becomes increasingly important for solid state drive (SSD) controllers to manage bit error rates in flash memory to ensure reliable operation of the SSD.

SUMMARY

The subject technology provides a method to adapt program verify offsets for flash memory cells. According to aspects, a method may include performing an adjustment iteration including: accessing error counts for respective N states of the plurality of memory cells; applying a weighting to the error counts, wherein the weighting is based on a binary data coding for the N states; determining a state Smin of the N states having a minimum error count Emin from the error counts; determining a state Smax of the N states having a maximum error count Emax from the error counts; determining a difference between the Emax and the Emin satisfies an error count threshold; adjusting, by a predefined value, a respective program verify offset of a lowest state from Smin and Smax, and of each state between Smin and Smax in the N states, wherein the adjusting is a decrement when Smin is less than Smax, and wherein the adjusting is an increment when Smin is greater than Smax.

In other aspects, a solid state drive may include a plurality of memory cells and a controller. The controller may be configured to perform an adjustment iteration. The adjustment iteration includes accessing error counts for respective N states of the plurality of memory cells; applying a weighting to the error counts, wherein the weighting is based on a binary data coding for the N states; determining a state Smin of the N states having a minimum error count Emin from the error counts; determining a state Smax of the N states having a maximum error count Emax from the error counts; determining a difference between the Emax and the Emin satisfies an error count threshold; and adjusting, by a predefined value, a respective program verify offset of a lowest state from Smin and Smax, and of each state between Smin and Smax in the N states, wherein the adjusting is a decrement when Smin is less than Smax, and wherein the adjusting is an increment when Smin is greater than Smax. The controller is also configured to repeat the performing of the adjustment iteration until the difference between the Emax and the Emin does not exceed the error count threshold, wherein a threshold number of program operations with the adjusted program verify offsets is met after each repeating.

In further aspects, a non-transitory machine-readable medium may include machine-executable instructions thereon that, when executed by a computer or machine, perform a method. In this regard, the method may include determining an adaptation is due for adjusting program verify offsets for N states programmable into a plurality of memory cells, wherein the determining is in response to a program/erase (P/E) cycle count for the plurality of memory cells reaching a periodic threshold value. The method may also include performing an adjustment iteration comprising: accessing error counts for respective N states of the plurality of memory cells; applying a weighting to the error counts, wherein the weighting is based on a binary data coding for the N states; determining a state Smin of the N states having a minimum error count Emin from the error counts; determining a state Smax of the N states having a maximum error count Emax from the error counts; determining a difference between the Emax and the Emin satisfies an error count threshold; adjusting, by a predefined value, a respective program verify offset of a lowest state from Smin and Smax, and of each state between Smin and Smax in the N states, wherein the adjusting is a decrement when Smin is less than Smax, and wherein the adjusting is an increment when Smin is greater than Smax.

In further aspects, a system may include means for performing an adjustment iteration comprising: means for accessing error counts for respective N states of the plurality of memory cells; means for applying a weighting to the error counts, wherein the weighting is based on a binary data coding for the N states; means for determining a state Smin of the N states having a minimum error count Emin from the error counts; means for determining a state Smax of the N states having a maximum error count Emax from the error counts; means for determining a difference between the Emax and the Emin satisfies an error count threshold; means for adjusting, by a predefined value, a respective program verify offset of a lowest state from Smin and Smax, and of each state between Smin and Smax in the N states, wherein the adjusting is a decrement when Smin is less than Smax, and wherein the adjusting is an increment when Smin is greater than Smax. The system may also include means for repeating the performing of the adjustment iteration until the difference between the Emax and the Emin does not exceed the error count threshold, wherein a threshold number of program operations with the adjusted program verify offsets is met after each repeating.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The subject technology proposes methods and systems to adapt program verify offsets for flash memory. By incrementing or decrementing program verify offsets in an iterative manner to distribute errors across pages stored in flash memory, error correction codes (ECC) can more readily correct bit errors, facilitating improved SSD reliability. Further, because the adjustments use simple addition or subtraction operations in an iterative loop, the adjustments can be readily implemented on controllers with limited power budget and/or processing resources.

Figure 1:
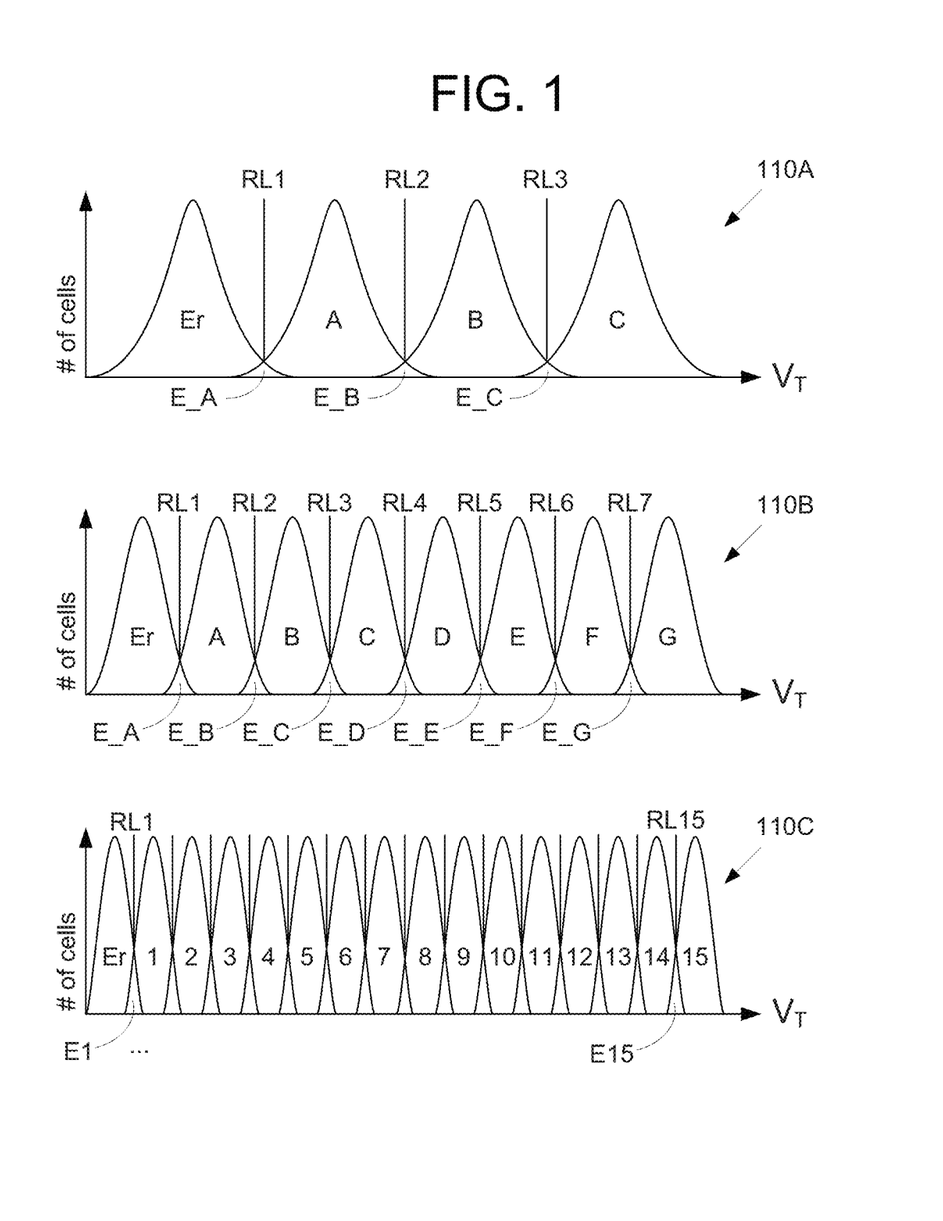
FIG. 1 presents a diagram of example program state distributions for MLC, TLC, and QLC flash memory cells.

FIG. 1 presents a diagram of example program state distributions for MLC, TLC, and QLC flash memory. FIG. 1 includes distribution 110A for MLC, distribution 110B for TLC, and distribution 110C for QLC. For example, referring to distribution 110A for MLC, the first peak may correspond to an erased (Er) state, the second peak may correspond to a state A, the third peak may correspond to a state B, and the fourth peak may correspond to a state C. Note that a scale for the Y-axis may be logarithmic.

Read levels are defined for distinguishing between program states, or RL1, RL2, and RL3 for respectively distinguishing between ER and A, A and B, and B and C in distribution 110A. As shown in distribution 110A, the states may not be completely separate from each other, which may lead to erroneous reads. For example, the error between the Er state and the A state may be defined by the error count $E\_A$, which includes two components: the portion of state A lower than RL1 that is erroneously read as state Er, and the portion of state Er higher than RL1 that is erroneously read as state A. Similarly, error count $E\_B$ may include the portion of state B lower than RL2 that is erroneously read as state A, and the portion of state A higher than RL2 that is erroneously read as state B. Finally, error count $E\_C$ may include the portion of state C lower than RL3 that is erroneously read as state B, and the portion of state B higher than RL3 that is erroneously read as state C. Thus, $E\_A$, $E\_B$, and $E\_C$ represent adjacent state errors in distribution 110A.

An example mapping of state errors to page errors is described in Table 1 below, wherein "LP" stands for lower page, "MP" stands for middle page, "UP" stands for upper page, and "TP" stands for top page:

MLC:
Err_LP=E_B
Err_UP=E_A+E_C
TLC:
Err_LP=E_A+E_E
Err_MP=E_B+E_D+E_F
Err_UP=E_C+E_G
QLC:
Err_LP=E5+E10+E12+E15
Err_MP=E2+E8+E14
Err_UP=E3+E7+E9+E13
Err_TP=E1+E4+E6+E11
Table 1.

For example, consider MLC, which has four possible states, or Er through C. This allows two pages, or an upper page and a lower page, to be written to each wordline. TLC, which has eight possible states, allows for three pages per wordline, or a lower page, a middle page, and an upper page. QLC, which has sixteen possible states, allows for four pages per wordline, or a lower page, a middle page, an upper page, and a top page.

Based on a specific binary coding or Gray coding used, the total error count for each flash page may be determined. For example, consider an example Gray coding for distribution 110A or MLC, which maps state Er to the binary value "11," state A to the binary value "01," state B to the binary value "00," and state C to the binary value "10." In this coding, the first bit transitions twice, or from state Er (1) to state A (0) at RL1 and from state B (0) to state C (1) at RL3. When the upper page corresponds to the first bit, the upper page error component or Err_UP includes E_A and E_C. On the other hand, the second bit only transitions once, or from state A (1) to state B (0) at RL2. When the lower page corresponds to the second bit, the lower page error component or Err_LP includes E_B. In this manner, a mapping of page errors from adjacent state errors can be determined for MLC based on the defined Gray coding, as shown in Table 1 above. A similar process may be used for memory cells with more states such as TLC and QLC.

As shown in Table 1 above, as the number of states in a memory cell increases, the complexity of the flash page error mapping also increases. For example, MLC pages include 1 or 2 adjacent state error components, whereas TLC pages include 2 or 3 adjacent state error components, and QLC pages include 3 or 4 adjacent state error components. To provide optimal error correction performance, bit errors are preferably distributed evenly across flash pages. This task becomes increasingly difficult as the number of error components increases per flash page.

Figure 2:
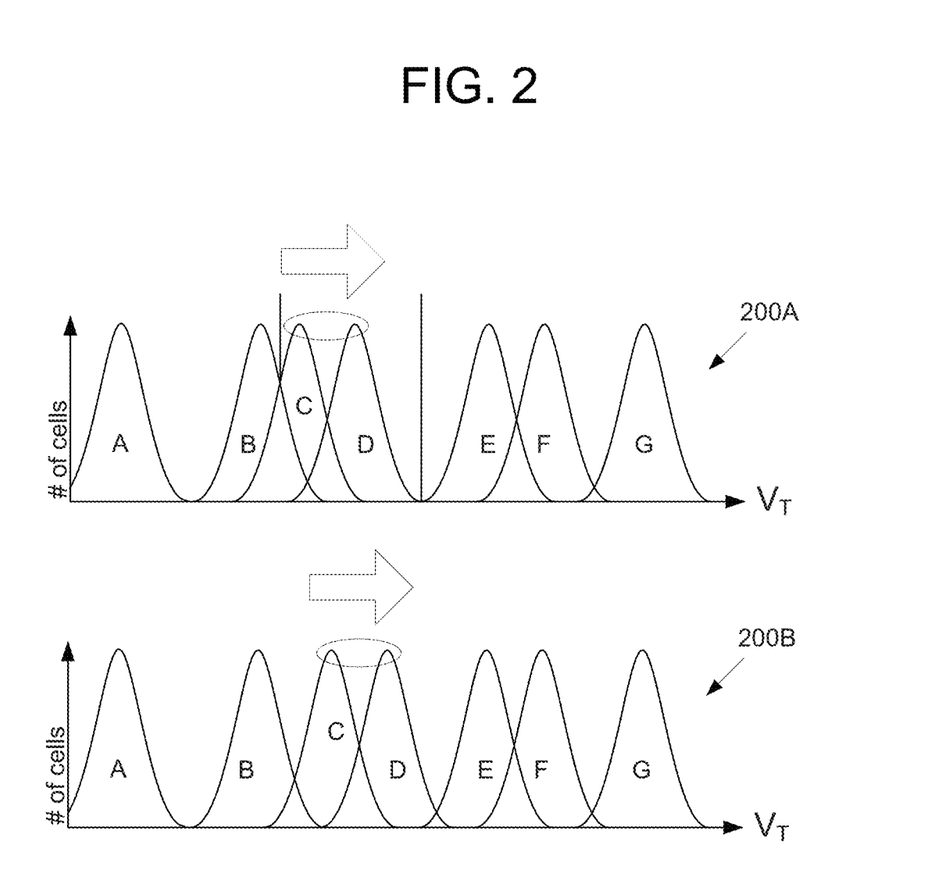
FIG. 2 is a diagram illustrating an example program state distribution for adjustment by program verify adaptation.

FIG. 2 is a diagram illustrating an example program state distribution for adjustment by program verify adaptation. As shown in FIG. 2, distribution 200A includes seven (7) possible program states A through G for an example TLC flash memory. Each state may be associated with a program verify voltage (PV), which may be set to a default value. When memory cells of the TLC flash memory are programmed to a target program state, programming and verify pulses may be issued until the last verify pulse indicates that the programmed memory cells satisfy the PV associated with the target program state.

However, since distribution 200A may drift and widen over time due to wear, temperature, and other factors, the controller may maintain and apply offsets to shift the PV for each state to reduce bit errors. Thus, when the programming and verify pulses are conducted for each program state, the last verify pulse is checked against a respective PV adjusted by an offset for each program state. For example, the offset for each PV may be stored in registers in the controller. To determine the values for the PV offsets, an iterative adjustment approach may be used as described below.

Initially, error counts for each of the states A through G can be accessed. For example, the controller of a SSD may maintain failed bit count (FBC) information, syndrome weight (SW), and/or other data that can be used to estimate the error counts of the states A through G.

The adaptation may use relative error counts between states rather than absolute values, and therefore the error counts for the states may merely need to be accurate with respect to each other. Thus, an approximation of the error counts for a SSD is acceptable, for example by sampling from a representative distribution of the plurality of memory cells. For example, every Nth block of a die may be examined, and X wordlines evenly distributed within each examined block may be read to sample the error counts. For example, every $20^{th}$ block of a die may be examined, with 16 wordlines evenly distributed within each block sampled for error counts. Since the blocks should have programmed data for sampling valid error counts, to determine every Nth block, one approach is to examine each Nth block and to find the nearest programmed block from each Nth block. Another approach is to examine every Nth block and only sample the programmed blocks. Yet another approach may be to examine a block mapping table that indicates which blocks are programmed blocks. As long as a representative distribution of programmed blocks is sampled approximately evenly across the die, any suitable algorithm can be used.

Further, while error counts are for errors between adjacent states, for notational simplicity, an error count that is associated or assigned to a respective state may represent an error count for the errors between that respective state000000 and its adjacent lower state. For example, an error count associated with state B may represent the errors between state A (the adjacent lower state) and state B.

After the error counts are accessed, the program states with the two error extremes are determined, for example maximum and minimum error counts. For example, in FIG. 2, assume that the state with the maximum error count is state C, or that the error count between states B and C is the maximum, and the state with the minimum error count is state E, or that the error count between states D and E is the minimum. Then, starting from the lowest or left-most state of the two error extremes, or state C, each state up to but not including the highest or right-most state of the two error extremes, or state E, is processed by adjusting the associated PV offset.

In this example, the states to be processed correspond to states C and D, as shown in distribution 200A. Accordingly, the PV offsets for states C and D may be adjusted by a predefined value, which is positive or negative depending on whether the left-most state of the two error extremes has a higher or lower error count of the two error extremes. Since the left-most state of the two error extremes has a higher error count, the predefined value may be positive to shift program state distributions to reduce error counts. Conversely, if the left-most state instead had a lower error count, then the predefined value may be negative, which also shifts program state distributions to reduce error counts. For example, corresponding PV offset register values for states C and D may be incremented or decremented by a predefined value, which may correspond to a voltage increment recognizable by a digital-to-analog converter circuit (DAC) for performing reads on the memory cells.

After an adjustment iteration, a number of program operations are performed with the adjusted PV offsets. For example, at least N wordlines may be written or programmed using the adjusted PV offsets, wherein N is a positive value. These program operations may be for user data written during normal device operation. Alternatively or additionally, these program operations may be for test data. After programming with the adjusted PV offsets, a minimum number of reads may be performed on the newly programmed data to accumulate error counts for the next adjustment iteration.

To update the error counts for the next adjustment iteration, various approaches are possible. In one approach, the controller may maintain and update error counts as read operations are processed for user data. In this approach, each adjustment iteration may initialize the error counts, and read operations for user data written with the adjusted PV offsets are used to update the error counts. After accumulating a minimum number of such read operations, the next adjustment iteration may proceed. This approach may minimize controller overhead as the error counts may be generated during normal reading of user data. However, a tradeoff is that a period between adjustment iterations may increase to ensure sufficient read activity for data written with the updated PV offsets.

Another approach is to perform test reads on the data written with the adjusted PV offsets, and to count the errors after the test reads. This approach may increase controller overhead due to the additional test reads, but may also ensure that the adjustment iterations can proceed on a regular periodic schedule. Thus, when adaptation speed is a priority, this approach may be preferred. In some aspects of the present technology, a combination of approaches may be utilized. For example, test reads may be performed to supplement user data reads that do not meet a minimum number within a predetermined time.

After satisfying a minimum number of read operations on data programmed with the adjusted PV offsets, distribution 200A may transition to a distribution similar to distribution 200B. As shown in distribution 200B of FIG. 2, states C and D move to the right or positively.

The above described adjustment process repeats until a difference between the maximum and minimum error counts goes below an error count threshold. The error count threshold is preferably calibrated to an optimum value that is high enough to reject noise while being low enough to improve error correction performance. This optimum value may be determined by trial and error testing, for example.

Figure 3A:
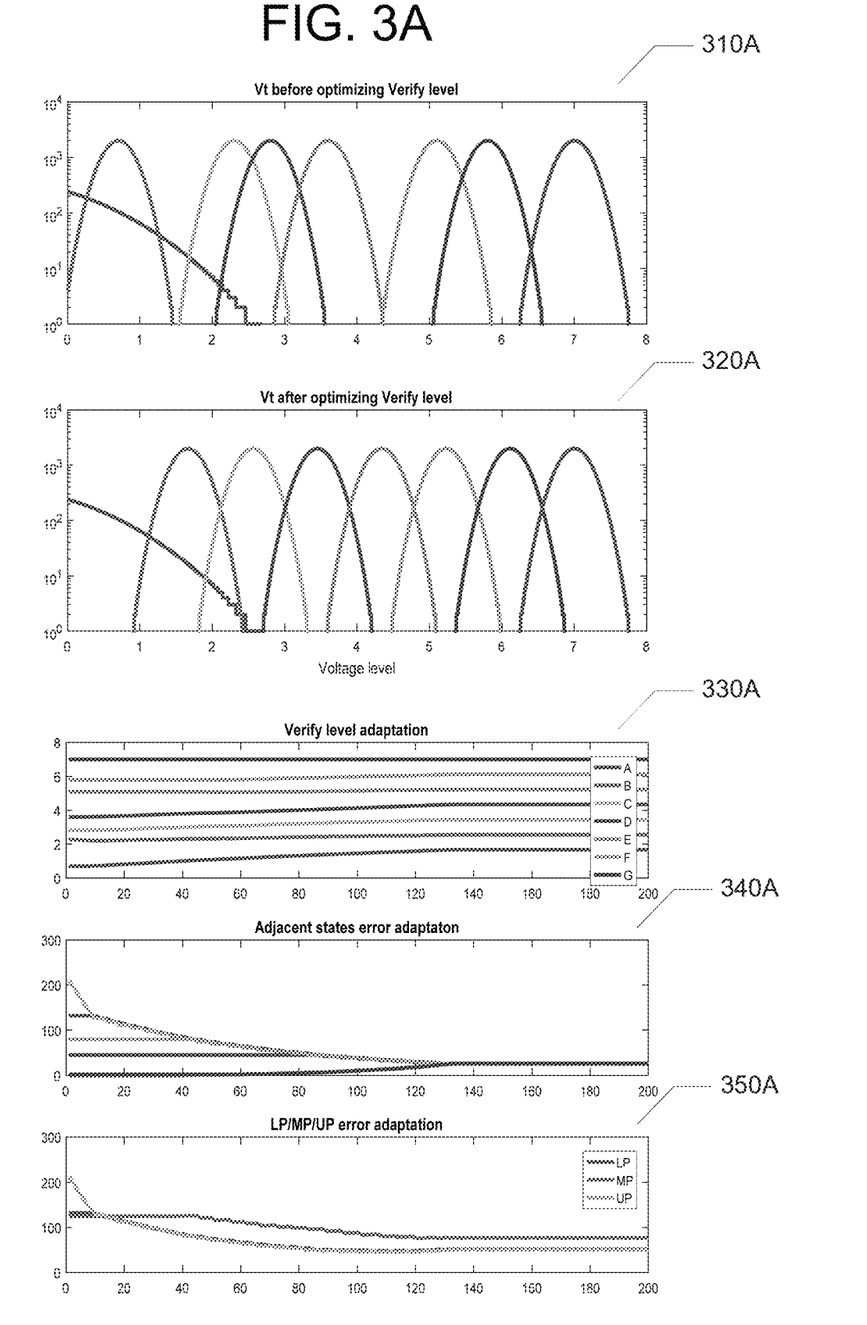
FIG. 3A shows a simulation for program verify adaptation applied to TLC for balancing adjacent state error counts.

FIG. 3A shows a simulation for program verify adaptation applied to TLC for balancing adjacent state error counts. FIG. 3A includes distribution 310A, distribution 320A, verify level adaptation graph 330A, adjacent state error adaptation graph 340A, and page error adaptation graph 350A. As shown in FIG. 3A, distribution 310A represents a sample distribution prior to program verify adaptation, whereas distribution 320A represents distribution 310A after applying program verify adaptation. As shown in verify level adaptation graph 330A, the verify levels stop adjusting at approximately iteration 140, wherein the verify levels are evenly spaced with respect to adjacent states. Adjacent state error adaptation graph 340A also shows each adjacent state error converging to approximately the same number of errors at approximately iteration 140. However, since the program verify adaptation in FIG. 3A is only concerned with balancing adjacent state error counts, it can be observed in page error adaptation graph 350A that the error count across pages is not considered, resulting in unbalanced error counts for lower, middle, and upper pages. For example, the middle page has significantly more errors than the lower and upper pages.

Figure 3B:
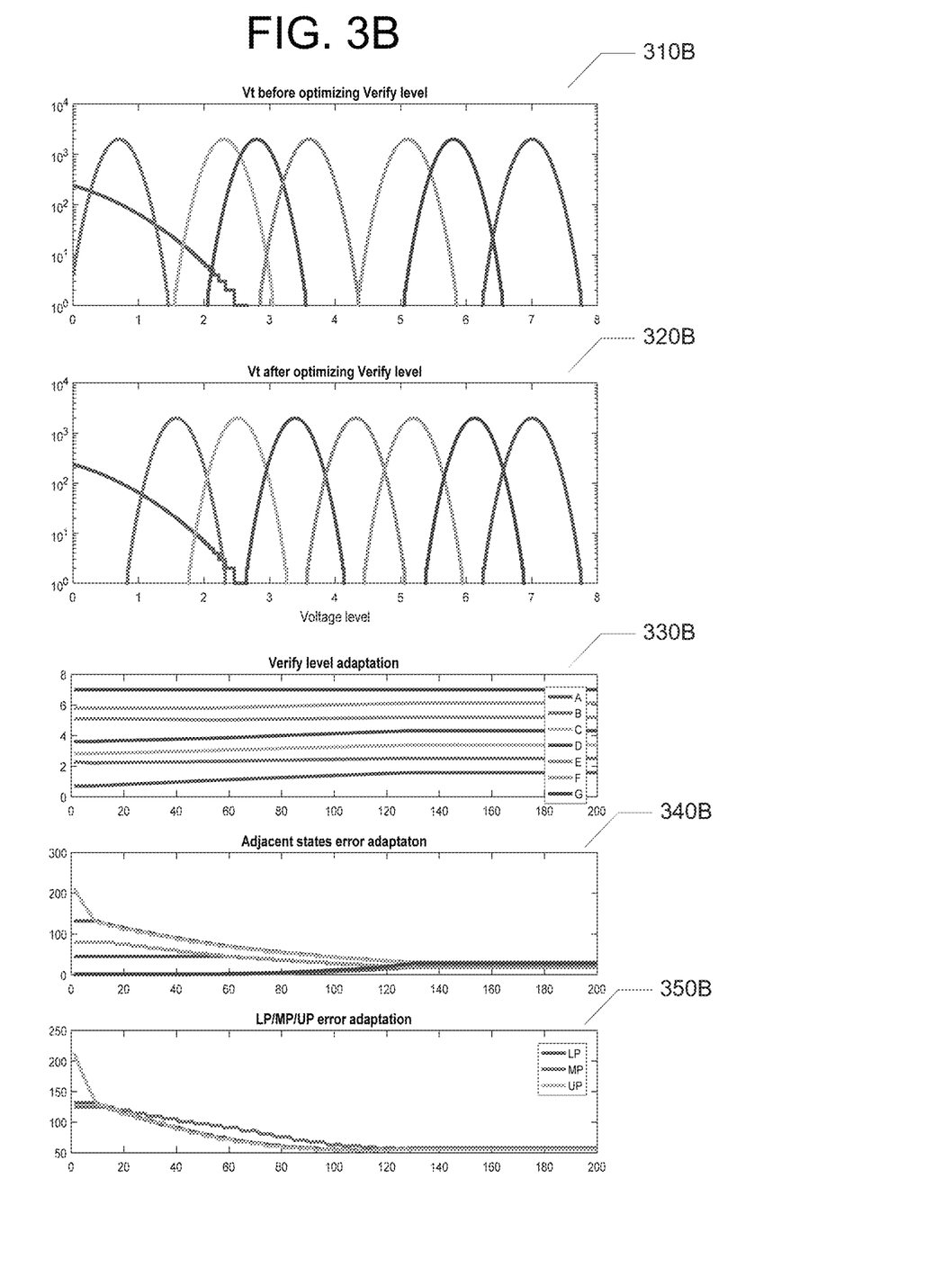
FIG. 3B shows a simulation for program verify adaptation applied to TLC for balancing page error counts.

Rather than balancing adjacent state errors, FIG. 3B shows a simulation for program verify adaptation applied to TLC for balancing page error counts. FIG. 3B includes distribution 310B, distribution 320B, verify level adaptation graph 330B, adjacent state error adaptation graph 340B, and page error adaptation graph 350B. To incorporate the pages in the balancing, a weighting matrix can be determined for adjusting the weight of each state's error contribution. For example, an error matrix representing each state's (adjacent) error contribution may be defined as e=[E_A, E_B, E_C, E_D, E_E, E_F, E_G]. Referring to the TLC portion of Table 1, the error weighting matrix can be defined as w=[½, ⅓, ½, ⅓, ½, ⅓, ½]. For example, the first value of the error weighting matrix is for the error E_A. Since E_A is in the lower page, or in Err_LP which has 2 components, the first value of w is ½. This process is repeated until the error for the final state, or E_G, is determined. Note that the weighting matrix only has 7 values rather than 8 values since the errors in error matrix e represent errors between adjacent states. Once the error weighting matrix "w" is determined, then the weighted error "we" can be determined from the error vector "e" by the following equation:

$$we = e * w \qquad \text{Equation 1.}$$

Thus, rather than balancing adjacent state errors using the non-weighted error vector as in FIG. 3A, FIG. 3B illustrates balancing adjacent state error using the weighted error vector we to balance errors between pages. As shown in FIG. 3B, the resulting adjacent state error adaptation graph 340B does not result in all states converging to the same error level, but instead to the error level appropriate for each state's error contribution to their respective page. Thus, the page error adaptation graph 350B shows the lower, middle, and upper pages converging to approximately the same error rate, a much more balanced result compared to page error adaptation graph 350A of FIG. 3A.

Figure 3C:
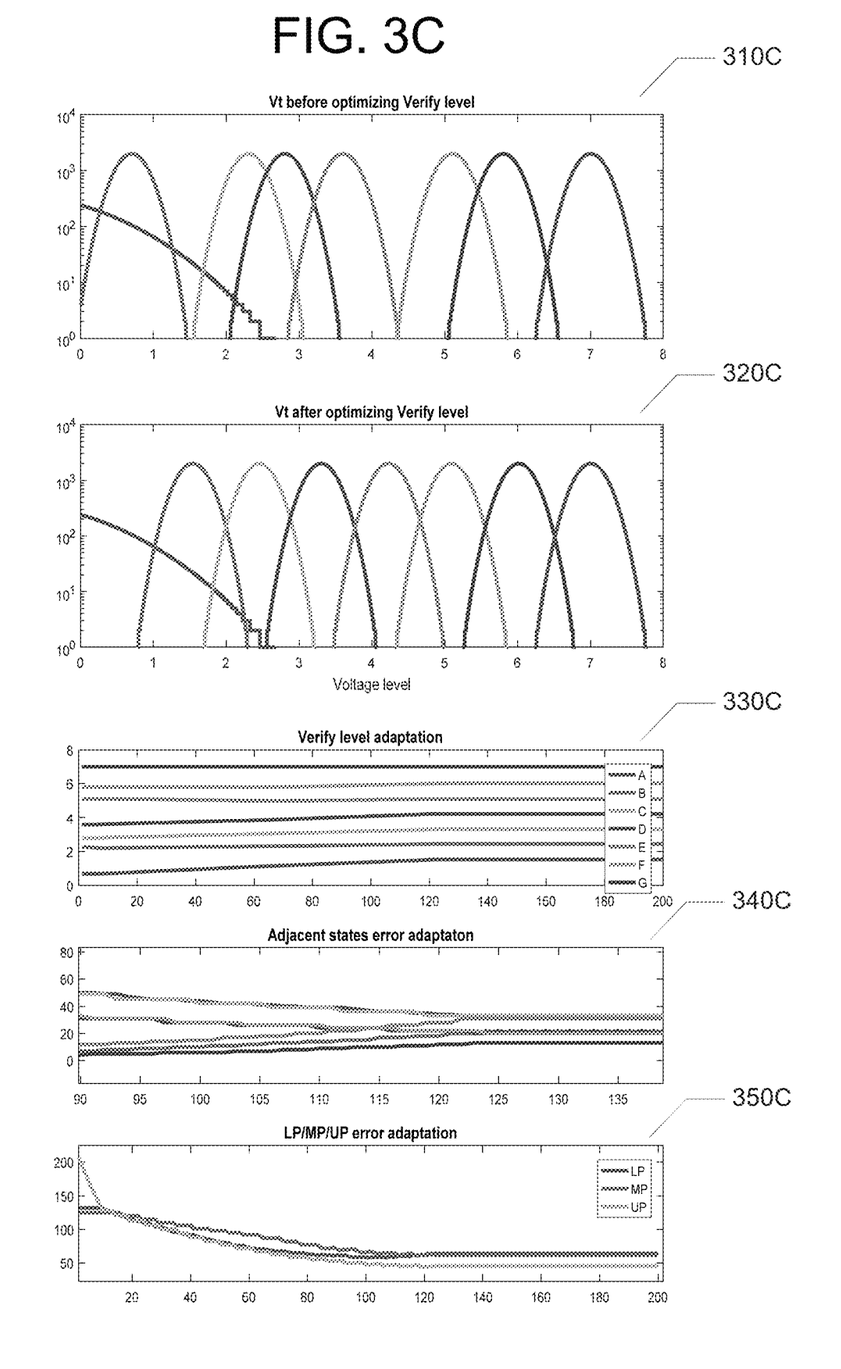
FIG. 3C shows a simulation for program verify adaptation applied to TLC for balancing page errors while reserving a margin for data retention.

FIG. 3C shows a simulation for program verify adaptation applied to TLC for balancing page errors while reserving a margin for data retention. FIG. 3C includes distribution 310C, distribution 320C, verify level adaptation graph 330C, adjacent state error adaptation graph 340C, and page error adaptation graph 350C. Data retention loss may pose a particular problem for programmed states having higher voltages. One mitigating step may be to apply a positive multiplier y>1 for a program verify level associated with the highest program state, or the G state. Alternatively, a register corresponding to the program verify level for the highest program state may be incremented by a preset value. The program verify levels for all the states may further be normalized to a maximum program verify level. As shown in FIG. 3C, data programmed at state G in distribution 320C now has more leeway to lose voltage compared to data programmed at state G in distribution 320B of FIG. 3B. However, the tradeoff is that more errors may be induced into the other states, as illustrated by page error adaptation graph 350C in FIG. 3C compared to page error adaptation graph 350B of FIG. 3B.

Figure 3D:
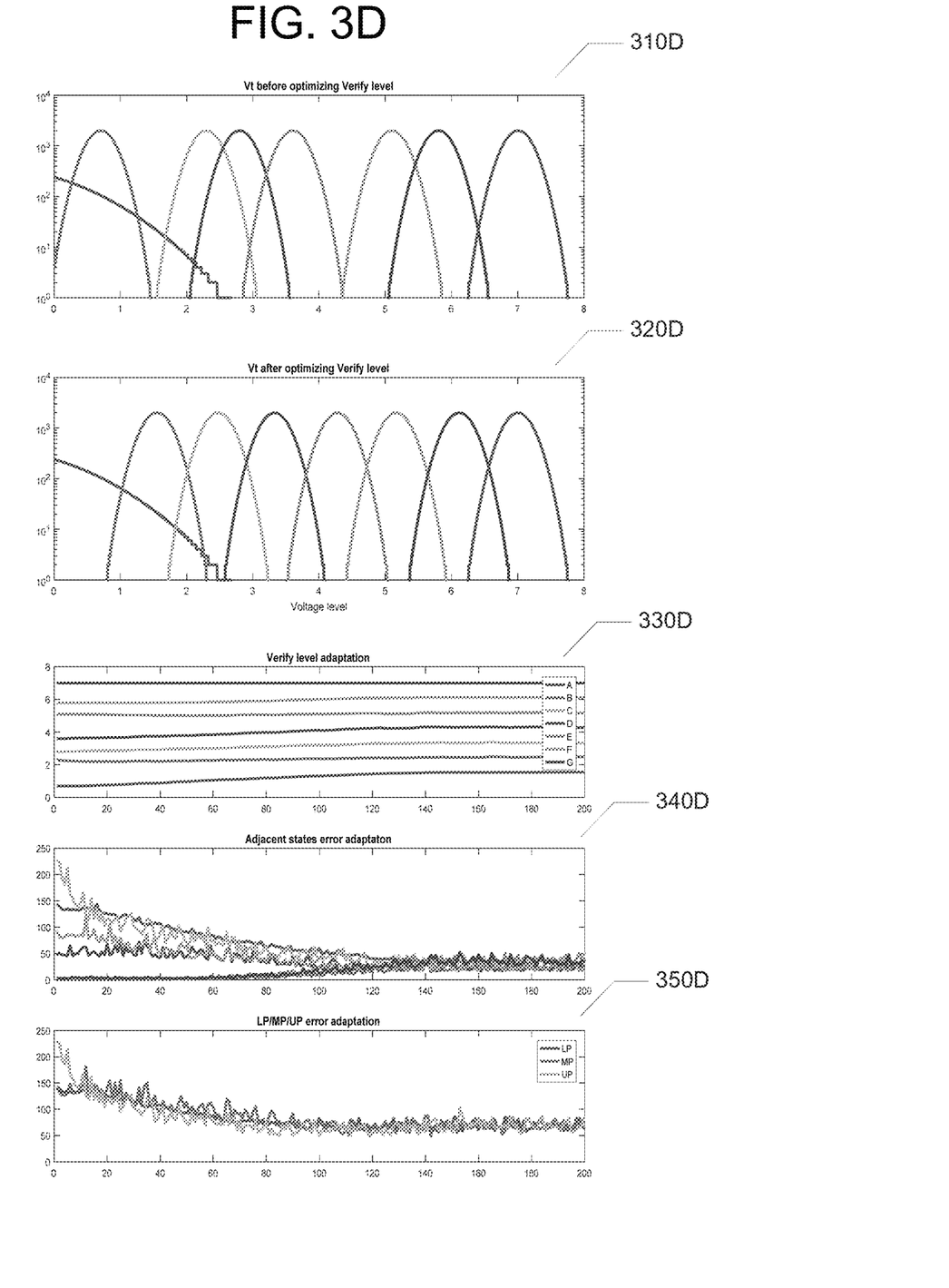
FIG. 3D shows a simulation for program verify adaptation applied to TLC for balancing page errors with non-optimal read level ranges.

FIG. 3D shows a simulation for program verify adaptation applied to TLC for balancing page errors with non-optimal read level ranges. FIG. 3D includes distribution 310D, distribution 320D, verify level adaptation graph 330D, adjacent state error adaptation graph 340D, and page error adaptation graph 350D. FIGS. 3A-3C all assumed that data reads always occur at the optimal read level specified by the SSD. However, real world DACs will not always perform this perfectly and will exhibit a range of reads that deviate from the optimal read level, for example from [−8: 8] DAC increments of the optimal read level. Thus, adjacent state error adaptation graph 340D and page error adaptation graph 350D exhibit fluctuations due to the non-optimal reads. However, the adjustment iterations described above may still proceed in the same fashion as with the assumed optimal read levels.

Figure 3E:
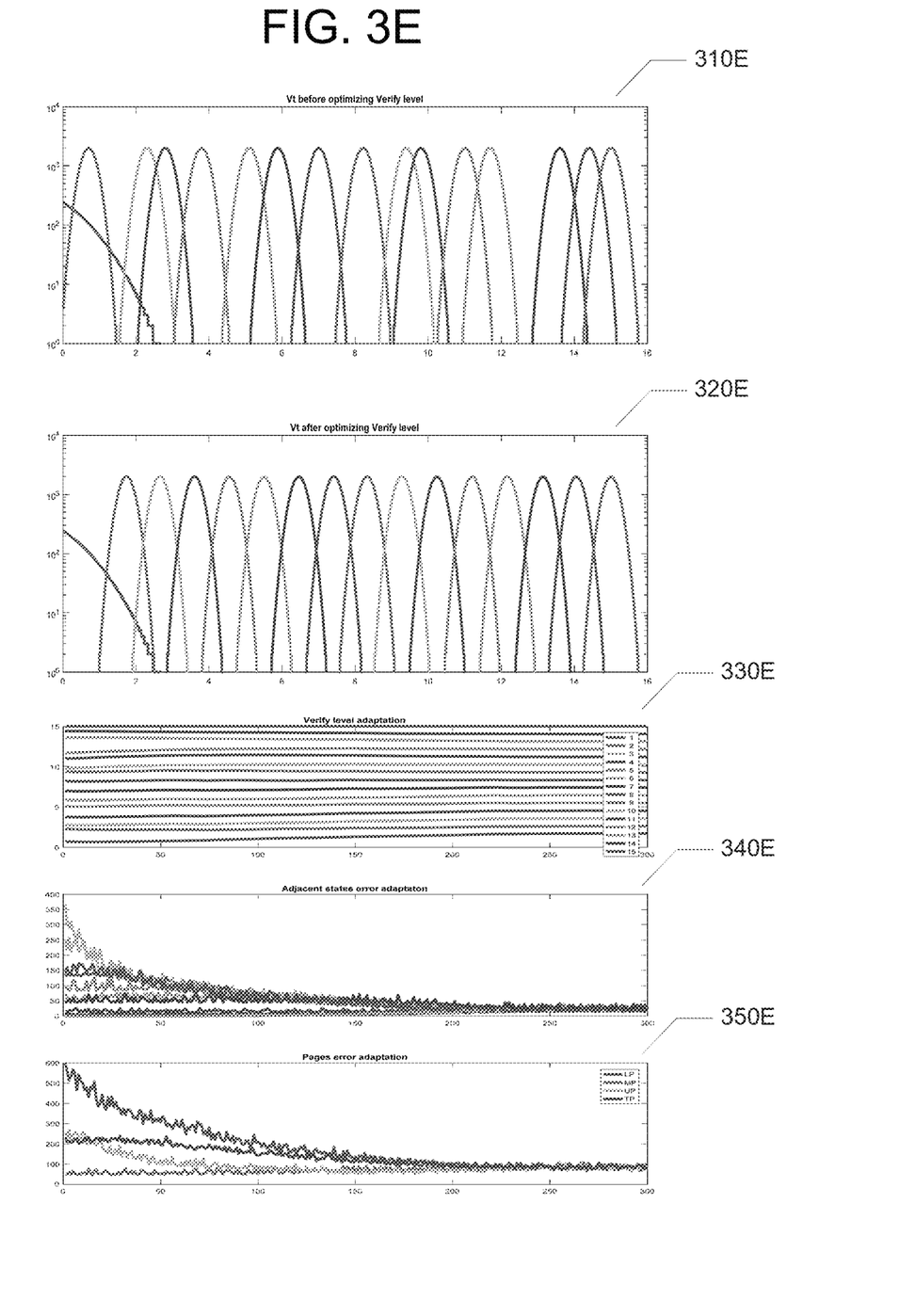
FIG. 3E shows a simulation for program verify adaptation applied to QLC for balancing page errors with non-optimal read level ranges.

FIG. 3E shows a simulation for program verify adaptation applied to QLC for balancing page errors with non-optimal read level ranges. FIG. 3E includes distribution 310E, distribution 320E, verify level adaptation graph 330E, adjacent state error adaptation graph 340E, and page error adaptation graph 350E. As shown in FIG. 3E, the program verify adaptation is scalable to apply to any level of cells, including high bit cells such as QLC, X5, and higher.

Figure 4A:
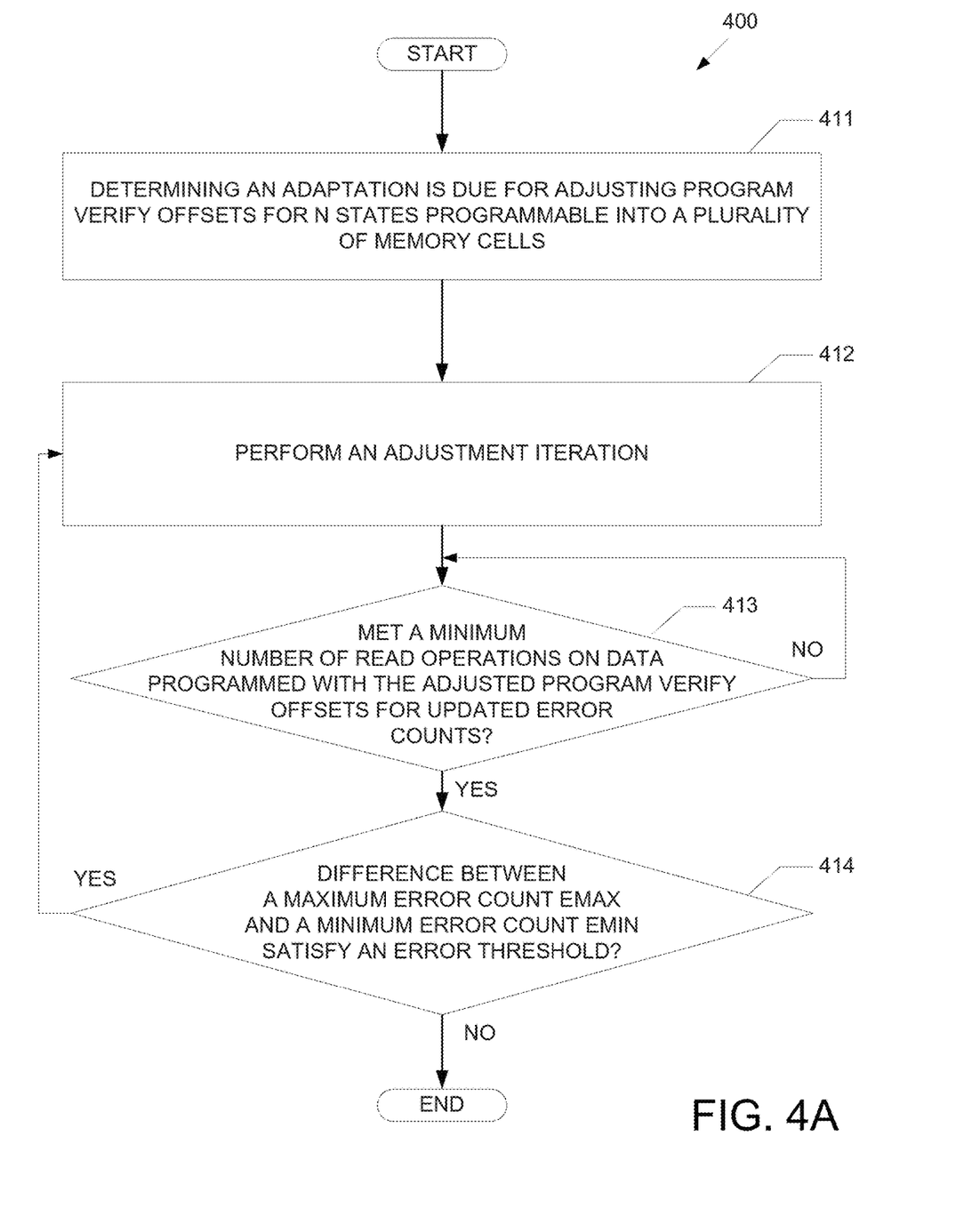
FIG. 4A is a flowchart illustrating an example process for providing program verify adaptation.

FIG. 4A is a flowchart illustrating an example process 400 for providing program verify adaptation, according to aspects of the subject technology. One or more blocks of FIG. 4A may be executed by a computing system (including, e.g., a data storage controller of an SSD, processor, or the like). Similarly, a non-transitory machine-readable medium may include machine-executable instructions thereon that, when executed by a computer or machine, perform the blocks of FIG. 4A.

Figure 5:
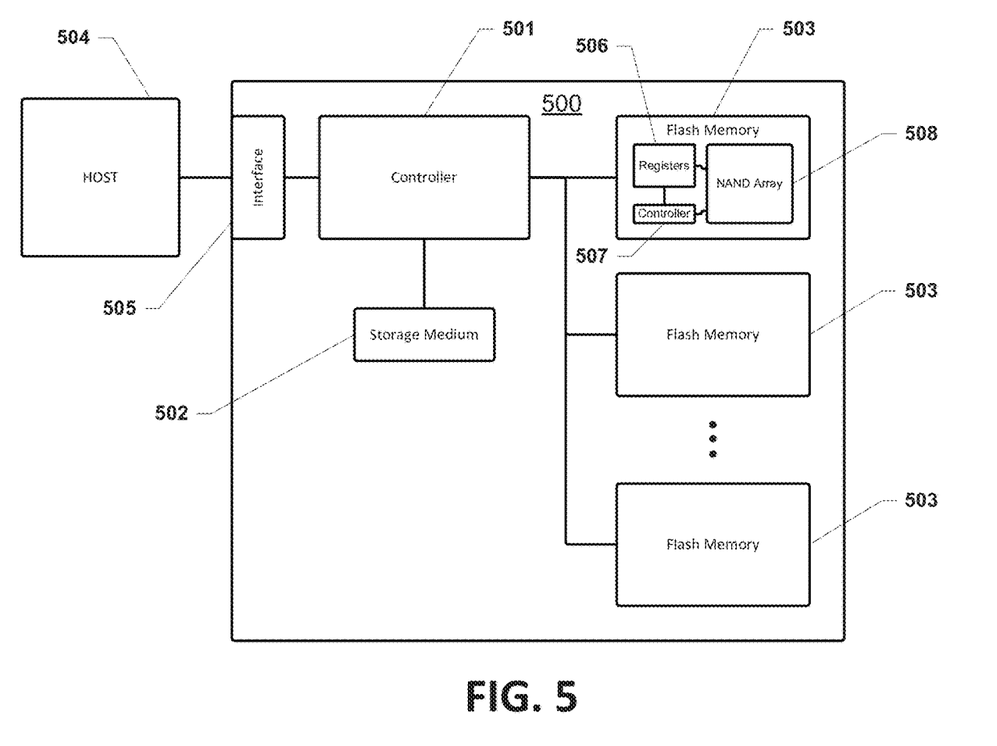
FIG. 5 is a block diagram illustrating components of an example data storage system.

In block 411, referring to FIG. 5, controller 501 determines an adaptation is due for adjusting program verify offsets for N states programmable into flash memory 503. For example, controller 501 may determine that a program/erase (P/E) cycle count for a die of flash memory 503 has reached a periodic threshold, such as every Nth P/E cycle, wherein N may be a positive number such as 8, 16, etc. Other triggers for determining that the adaptation is due may include a change in environmental operating conditions such as ambient temperature, a change in date since a last power cycle, or meeting other conditions that may result in changes to the program state distribution that would benefit from the adaptation.

In block 412, referring to FIG. 5, controller 501 performs an adjustment iteration, which is described below in greater detail in conjunction with FIG. 4B.

In block 413, referring to FIG. 5, controller 501 determines whether a threshold number of read operations on data programmed with the adjusted program verify offsets is met to provide updated error counts. For example, controller 501 may program N wordlines using the adjusted program verify offsets from block 412. As discussed above, controller 501 may perform a threshold number of user data and/or test read operations on the N wordlines to provide an updated set of error counts before proceeding to block 414.

In block 414, referring to FIG. 5, controller 501 checks whether a difference between a maximum error count Emax and a minimum error count Emin satisfies an error count threshold. If the difference satisfies the error count threshold, then process 400 returns to perform another iteration of block 412. If the difference does not satisfy the error count threshold, then the pages have been successfully error balanced and process 400 ends. The details of each iteration in block 412 are described below in conjunction with FIG. 4B.

Figure 4B:
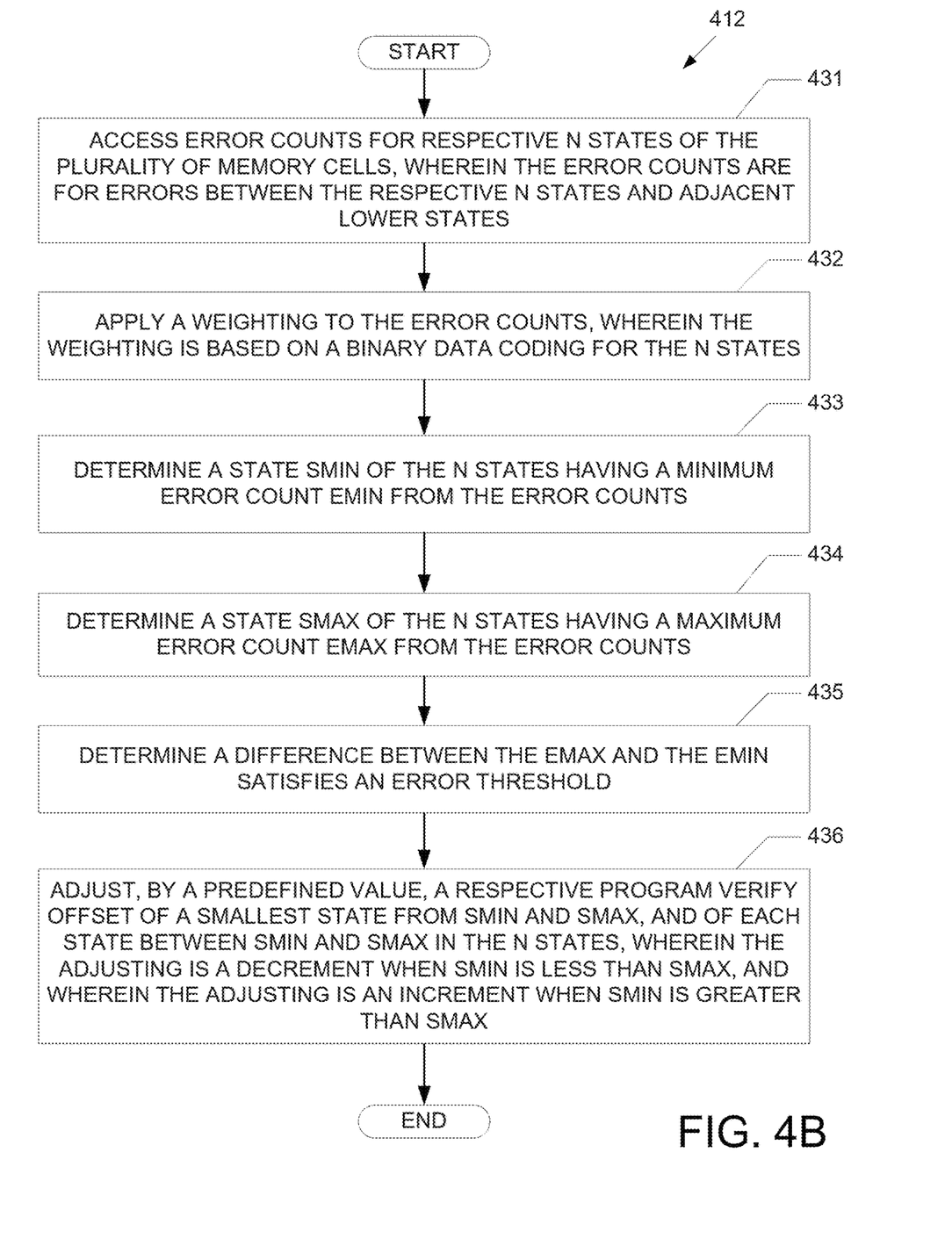
FIG. 4B is a flowchart illustrating an example process for performing an adjustment iteration.

FIG. 4B is a flowchart illustrating an example block 412 for performing an adjustment iteration, according to aspects of the subject technology. One or more blocks of FIG. 4B may be executed by a computing system (including, e.g., a data storage controller of an SSD, processor, or the like). Similarly, a non-transitory machine-readable medium may include machine-executable instructions thereon that, when executed by a computer or machine, perform the blocks of FIG. 4B.

In block 431, referring to FIG. 5, controller 501 accesses error counts for respective N states of flash memory 503, wherein the error counts are for errors between the respective N states and adjacent lower states. For example, if NAND array 508 of flash memory 503 includes QLC memory, then N=15 (4 bits per cell). Since the first state is the erased state and error counts for a state are between that state and the adjacent lower state, 2^4−1 or 15 error counts may be considered. As discussed above, the state error counts may be derived from FBC or other data. For example, assuming that flash memory 503 includes QLC memory, the error counts may be represented by an error matrix e=[E1, E2, E3, E4, E5, E6, E7, E8, E9, E10, E11, E12, E13, E14, E15].

In block 432, referring to FIG. 5, controller 501 applies a weighting to the error counts, wherein the weighting is based on a binary data coding or Gray coding for the N states. For example, using Table 1 as shown above and assuming that flash memory 503 includes QLC memory, the weighting matrix w=[¼, ⅓, ¼, ¼, ¼, ¼, ¼, ⅓, ¼, ¼, ¼, ¼, ¼, ⅓, ¼]. Thus, the weighted error counts we=e*w=[E1/4, E2/3, E3/4, E4/4, E5/4, E6/4, E7/4, E8/3, E9/4, E10/4, E11/4, E12/4, E13/4, E14/3, E15/4].

In block 433, referring to FIG. 5, controller 501 determines a state Smin of the N states having a minimum error count Emin from the error counts. A sort or linear traversal can be used to determine Emin and the corresponding Smin.

In block 434, referring to FIG. 5, controller 501 determines a state Smax of the N states having a maximum error count Emin from the error counts. Block 434 may be carried out similarly to block 433.

In block 435, referring to FIG. 5, controller 501 determines a difference between the Emax and the Emin satisfies an error count threshold. The error count threshold may be preset to a particular value to balance performance and data reliability.

In block 436, referring to FIG. 5, controller 501 adjusts, by a predefined value, a respective program verify offset of a lowest state from Smin and Smax, and of each state between Smin and Smax in the N states, wherein the adjusting is a decrement when Smin<Smax, and wherein the adjusting is an increment when Smin>Smax. This may be represented in equation form below:

For all states $j$ satisfying $\min(Smin,Smax) \leq j < \max(Smin,Smax)$, adjust program verify offset by the equation $$ProgV\_offset(j) = ProgV\_offset(j) + \text{sign}(Smin - Smax) * DAC \quad \text{Equation 2}$$

wherein the function "sign" returns +1 or −1 depending on the sign of the result, and wherein "DAC" corresponds to a voltage increment recognized by a DAC for reading the memory cells.

Note that Smin does not necessarily need to be a lower state than Smax; rather, Smin is the state associated with Emin, and Smax is the state associated with Emax. Thus, there may be situations where Smin>Smax, for example when Smax is state C and Smin is state E. In this case, since (Smin−Smax) is a positive number in Equation 2, the adjusting is an increment by "DAC" or increasing by a DAC recognizable voltage increment. As discussed above, this increment may be effected by incrementing corresponding registers. If Smax was instead state E and Smin was state C, then (Smin−Smax) is a negative number in Equation 2, and the adjusting is a decrement by "DAC" or decreasing by the DAC recognizable voltage increment.

Further, as discussed above, the program verify offset for the highest voltage state may be modified for mitigating data retention loss, for example by applying a positive multiplier y wherein y>1, and optionally performing a normalization of the program verify offsets for each state according to a maximum program verify level.

FIG. 5 is a block diagram illustrating components of an example data storage system, according to aspects of the subject technology. As depicted in FIG. 5, in some aspects, data storage system 500 (e.g., a solid state drive) includes data storage controller 501, storage medium 502, and flash memory 503. Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504. As will be described in more detail below, controller 501 is also configured to predict when current read levels and/or settings are suspect and to estimate new read levels when it is predicted that the current read levels and/or settings need to be changed. If the estimated read levels are proven to be insufficient, controller 501 may be configured to perform further iterative adjustments to correct the read level parameters. By dynamically adjusting read levels of the memory 503, the subject technology may extend the number of program/erase operations that may be performed on memory cells within flash memory 503 in a particular application environment, and increase the endurance of the memory cells compared to the same application environment operating without the ability to dynamically adjust read levels.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules. While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508.

It should be understood that in all cases data may not always be the result of a command received from host 504 and/or returned to host 504. In some aspects, Controller 501 may be configured to execute a read operation independent of host 504 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for adapting program verify offsets for a memory of a solid state drive (SSD), the method comprising:
    programming the memory by a controller of the SSD, wherein the controller is coupled to the memory, wherein the memory comprises one or more dies, wherein each of the one or more dies comprises blocks, wherein each of the blocks comprises wordlines, wherein each of the wordlines comprises memory cells, wherein the programming programs a plurality of memory cells within the one or more dies into N states, wherein each of the N states of the plurality of memory cells is associated with a program verify voltage;
    performing, by the controller, an adjustment iteration on the one or more dies, wherein performing the adjustment iteration includes incrementing or decrementing the program verify offsets in an iterative manner to distribute errors across pages stored in the memory, wherein performing the adjustment iteration improves bit error correction and the SSD's reliability over not performing the adjustment iteration, and wherein performing the adjustment iteration comprises:
        accessing, by the controller, error counts for the respective N states of the plurality of memory cells within the one or more dies, wherein the error counts are for errors between the respective N states and adjacent lower states;
        applying, by the controller, a weighting to the error counts, wherein the weighting is based on a binary data coding for the N states;
        determining, by the controller, a state Smin of the N states having a minimum error count Emin from the error counts;
        determining, by the controller, a state Smax of the N states having a maximum error count Emax from the error counts;
        determining, by the controller, a difference between the Emax and the Emin satisfies an error count threshold; and
        adjusting using the controller, by a predefined value, a respective program verify offset of a lowest state from Smin and Smax, and of each state between Smin and Smax in the N states,
            wherein the predefined value is a voltage increment recognizable by a digital-to-analog converter circuit for performing reads on one or more memory cells within the one or more dies,
            wherein the adjusting is a decrement when Smin is less than Smax, and
            wherein the adjusting is an increment when Smin is greater than Smax;
    storing, by the controller, the adjusted program verify offsets into registers; and
    programming, by the controller, at least some of the wordlines using the adjusted program verify offsets.

2. The method of claim 1, further comprising, prior to performing the adjustment iteration:
 determining an adaptation is due for adjusting the program verify offsets for the N states programmable into the plurality of memory cells.

3. The method of claim 2, wherein determining the adaptation is due is by a program/erase (P/E) cycle count for the plurality of memory cells reaching a periodic threshold value.

4. The method of claim 1, further comprising:
 repeating the performing of the adjustment iteration until the difference between the Emax and the Emin does not satisfy the error count threshold, wherein a minimum number of read operations on data programmed with the adjusted program verify offsets is met after each repeating.

5. The method of claim 1, further comprising:
 incrementing the program verify offset of a highest program state of the N states.

6. The method of claim 1, wherein the error counts are sampled from a representative distribution of the plurality of memory cells.

7. A solid state drive for facilitating adaption of program verify offsets for a plurality of memory cells, the solid state drive comprising:
 a plurality of memory devices comprising one or more dies, wherein each of the one or more dies comprises blocks, wherein each of the blocks comprises wordlines, wherein each of the wordlines comprises memory cells; and
 a controller configured to:
  program the plurality of memory cells within the one or more dies into N states, wherein each of the N states of the plurality of memory cells is associated with a program verify voltage;
  perform an adjustment iteration on the one or more dies, wherein performing the adjustment iteration includes incrementing or decrementing the program verify offsets in an iterative manner to distribute errors across pages stored in the plurality of memory devices, wherein performing the adjustment iteration facilitates improvement of bit error correction and the solid state drive's reliability over not performing the adjustment iteration, and wherein performing the adjustment iteration comprises:
   accessing error counts for respective N states of the plurality of memory cells in a memory device of the plurality of memory devices, wherein the error counts are for errors between the respective N states and adjacent lower states;
   applying a weighting to the error counts, wherein the weighting is based on a binary data coding for the N states;
   determining a state Smin of the N states having a minimum error count Emin from the error counts;
   determining a state Smax of the N states having a maximum error count Emax from the error counts;
   determining a difference between the Emax and the Emin satisfies an error count threshold; and
   adjusting, by a predefined value, a respective program verify offset of a lowest state from Smin and Smax, and of each state between Smin and Smax in the N states,
    wherein the predefined value is a voltage increment recognizable by a digital-to-analog converter circuit for performing reads on one or more memory cells in the memory device of the plurality of memory devices,
    wherein the adjusting is a decrement when Smin is less than Smax, and
    wherein the adjusting is an increment when Smin is greater than Smax;
  repeat the performing of the adjustment iteration until the difference between the Emax and the Emin does not satisfy the error count threshold, wherein a minimum number of read operations on data programmed with the adjusted program verify offsets is met after each repeating;
  store the adjusted program verify offsets into registers; and
  program at least some of the wordlines using the adjusted program verify offsets.

8. The solid state drive of claim 7, wherein the controller is further configured to:
 determine, prior to performing the adjustment iteration, that an adaptation is due for adjusting the program verify offsets for the N states programmable into the plurality of memory cells.

9. The solid state drive of claim 8, wherein the controller is configured to determine that the adaptation is due when a program/erase (P/E) cycle count for the plurality of memory cells reaches a periodic threshold value.

10. The solid state drive of claim 7, wherein the controller is further configured to:
 increment the program verify offset of a highest program state of the N states.

11. The solid state drive of claim 7, wherein the controller is configured to sample the error counts from a representative distribution of the plurality of memory cells.

12. A non-transitory machine-readable medium including machine-executable instructions thereon that, when executed by a processor, perform a method for adapting a plurality of program verify offsets for a memory of a solid state drive (SSD), wherein the method comprises:
 programming the memory by the processor, wherein the processor is coupled to the memory, wherein the memory comprises one or more dies, wherein each of the one or more dies comprises blocks, wherein each of the blocks comprises wordlines, wherein each of the wordlines comprises memory cells, wherein the programming programs a plurality of memory cells within the one or more dies into N states, wherein each of the N states of the plurality of memory cells is associated with a program verify voltage;
 determining, by the processor, an adaptation is due for adjusting program verify offsets for the N states of the plurality of memory cells, wherein the determining is by a program/erase (P/E) cycle count for the plurality of memory cells reaching a periodic threshold value; and
 performing, by the processor, an adjustment iteration on the one or more dies, wherein performing the adjustment iteration includes incrementing or decrementing the program verify offsets in an iterative manner to distribute errors across pages stored in the memory, wherein performing the adjustment iteration improves bit error correction and the SSD's reliability over not performing the adjustment iteration, and wherein performing the adjustment iteration comprises:
  accessing, by the processor, error counts for the respective N states of the plurality of memory cells within the one or more dies, wherein the error counts are for errors between the respective N states and adjacent lower states;

applying, by the processor, a weighting to the error counts, wherein the weighting is based on a binary data coding for the N states;

determining, by the processor, a state Smin of the N states having a minimum error count Emin from the error counts;

determining, by the processor, a state Smax of the N states having a maximum error count Emax from the error counts;

determining, by the processor, a difference between the Emax and the Emin satisfies an error count threshold; and adjusting using the processor, by a predefined value, a respective program verify offset of a lowest state from Smin and Smax, and of each state between Smin and Smax in the N states,
wherein the predefined value is a voltage increment recognizable by a digital-to-analog converter circuit for performing reads on one or more memory cells within the one or more dies,
wherein the adjusting is a decrement when Smin is less than Smax, and
wherein the adjusting is an increment when Smin is greater than Smax;

storing, by the processor, the adjusted program verify offsets into registers; and programming, by the processor, at least some of the wordlines using the adjusted program verify offsets.

13. The non-transitory machine-readable medium of claim 12, wherein the method further comprises:
repeating the performing of the adjustment iteration until the difference between the Emax and the Emin does not satisfy the error count threshold, wherein a threshold number of read operations on data programmed with the adjusted program verify offsets is met after each repeating.

14. The non-transitory machine-readable medium of claim 12, wherein the method further comprises:
incrementing the program verify offset of a highest program state of the N states.

15. The non-transitory machine-readable medium of claim 12, wherein the error counts are sampled from a representative distribution of the plurality of memory cells.

16. A system for facilitating adaption of program verify offsets for a memory, the system comprising:
means for programming the memory, wherein the memory comprises one or more dies, wherein each of the one or more dies comprises blocks, wherein each of the blocks comprises wordlines, wherein each of the wordlines comprises memory cells, wherein the programming programs a plurality of memory cells within the one or more dies into N states, wherein each of the N states of the plurality of memory cells is associated with a program verify voltage;
means for performing an adjustment iteration, wherein the means for performing the adjustment iteration includes means for incrementing or decrementing the program verify offsets in an iterative manner to distribute errors across pages stored in the memory, wherein the means for performing the adjustment iteration facilitates improvement of bit error correction and the system's reliability over not performing the adjustment iteration, and wherein the means for performing the adjustment iteration comprises:
means for accessing error counts for the respective N states of the plurality of memory cells within the one or more dies, wherein the error counts are for errors between the respective N states and adjacent lower states;
means for applying a weighting to the error counts, wherein the weighting is based on a binary data coding for the N states;
means for determining a state Smin of the N states having a minimum error count Emin from the error counts;
means for determining a state Smax of the N states having a maximum error count Emax from the error counts;
means for determining a difference between the Emax and the Emin satisfies an error count threshold; and
means for adjusting, by a predefined value, a respective program verify offset of a lowest state from Smin and Smax, and of each state between Smin and Smax in the N states,
wherein the predefined value is a voltage increment recognizable by a digital-to-analog converter circuit for performing reads on one or more memory cells within the one or more dies,
wherein the adjusting is a decrement when Smin is less than Smax, and
wherein the adjusting is an increment when Smin is greater than Smax;
means for repeating the performing of the adjustment iteration until the difference between the Emax and the Emin does not satisfy the error count threshold, wherein a threshold number of read operations on data programmed with the adjusted program verify offsets is met after each repeating;
means for storing the adjusted program verify offsets into registers; and
means for programming at least some of the wordlines using the adjusted program verify offsets.

17. The system of claim 16, further comprising:
means for determining an adaptation is due for adjusting the program verify offsets for the N states programmable into the plurality of memory cells.

18. The system of claim 17, wherein determining the adaptation is due is by a program/erase (P/E) cycle count for the plurality of memory cells reaching a periodic threshold value.

19. The system of claim 16, further comprising:
means for incrementing the program verify offset of a highest program state of the N states.

20. The system of claim 16, wherein the error counts are sampled from a representative distribution of the plurality of memory cells.

* * * * *